(12) United States Patent
Allibert et al.

(10) Patent No.: US 7,449,395 B2
(45) Date of Patent: Nov. 11, 2008

(54) METHOD OF FABRICATING A COMPOSITE SUBSTRATE WITH IMPROVED ELECTRICAL PROPERTIES

(75) Inventors: Frédéric Allibert, Grenoble (FR); Sébastien Kerdiles, Saint Ismier (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 102 days.

(21) Appl. No.: 11/473,411

(22) Filed: Jun. 23, 2006

(65) Prior Publication Data

US 2007/0173033 A1 Jul. 26, 2007

(30) Foreign Application Priority Data

Jan. 23, 2006 (FR) ................................... 06 00595

(51) Int. Cl.
H01L 21/30 (2006.01)
H01L 21/46 (2006.01)

(52) U.S. Cl. ........................................ 438/459; 438/458

(58) Field of Classification Search .................. 438/458, 438/459
See application file for complete search history.

(56) References Cited

U.S. PATENT DOCUMENTS

| 6,358,866 | B1 | 3/2002 | Stesmans et al. | 438/770 |
|---|---|---|---|---|
| 7,259,106 | B2* | 8/2007 | Jain | 438/737 |
| 2002/0137265 | A1 | 9/2002 | Yamazaki et al. | 438/150 |
| 2004/0029359 | A1 | 2/2004 | Letertre et al. | 438/458 |
| 2004/0031979 | A1 | 2/2004 | Lochtefeld et al. | 257/233 |
| 2005/0014346 | A1* | 1/2005 | Mitani et al. | 438/459 |
| 2006/0014363 | A1* | 1/2006 | Daval et al. | 438/455 |
| 2006/0160328 | A1* | 7/2006 | Daval | 438/455 |

FOREIGN PATENT DOCUMENTS

| EP | 0975 011 A1 | 1/2000 |
|---|---|---|
| WO | WO 03/103057 A1 | 12/2003 |
| WO | WO 2005/014895 A1 | 2/2005 |
| WO | WO 2005/086227 A1 | 9/2005 |

OTHER PUBLICATIONS

Schjolberg-Henriksen, K. "Oxide charges induced by plasma activation for wafer bonding" Sensors and Actuators A 102 2002 p. 99-105.*

(Continued)

Primary Examiner—Walter L. Lindsay, Jr.
Assistant Examiner—Grant S Withers
(74) Attorney, Agent, or Firm—Winston & Strawn LLP (57) ABSTRACT

The invention concerns a method of fabricating a composite substrate comprising at least one thin insulating layer interposed between a support substrate and an active layer of semiconductor material. The method comprises: providing a source substrate that comprises a semiconductor material and a support substrate; forming or depositing an insulating layer on the source substrate; providing recovery heat treatment of the insulating layer; providing plasma activation of a front face of the recovery heat treated insulating layer or a front face of the support substrate; molecular bonding, after the plasma activation, the front face of the insulating layer with the front face of the support substrate to form a bonded substrate; and lifting off a back portion of the source substrate from the bonded substrate to retain an active layer that comprises a remaining portion of the source substrate.

20 Claims, 5 Drawing Sheets

OTHER PUBLICATIONS

Green M. L. "Ultrathin (<4nm) SiO2 and Si-O-N gate dielectric layers for silicon microelectronics: Understanding the processing, structure, and physical and electrical limits" Journal of Applied Physics vol. 90, No. 5 Sep. 1, 2001 p. 2110-2111.*

Maleville, Christophe "Smart-CutR technology: from 300 mm ultrathin SOI production to advanced engineered substrates" Solid-State Electronics 48 2004 p. 1055-1063.*

C.P. Chang et al., "A Highly Manufacturable Corner Rounding Solution for 0.18 μm Shallow Trench Isolation," IEDM 1997, pp. 661-664.

Suni et al, "Effect Of Plasma Activation On Hydrophilic Bonding Of Si and $SiO_2$" Electrochemical Society Proceedings, vol. 27, pp. 22-30 (2001).

Schjolberg-Henriksen, K. et al., "Oxide Charges Induced By Plasma Activation For Wafer Bonding", Sensors and Actuators, vol. A 102, pp. 99-105 (2002).

Green, et al., "Ultrathin (<4nm) $SiO_2$ and Si-O-N gate Dielectric Layers For Silicon Microelectronics: Understanding The Processing, Structure And Physical And Electrical Limits", Journal of Applied Physics, vol. 90, No. 5, pp. 2001-2121 2086 (2001).

Sakaguchi, K., et al., "Eltran® By Splitting Porous Si Layers", The ElectroChemical Society Inc. PV99-3, Silicon-on-insulator technology and devices, P.L. Hemment, pp. 116-121, 1999.

Maleville, C., et al., "Smart Cut™ Technology: From 300 nm Ultrathin SOI Production To Advanced Engineered Substrates", Solid State Electronics, vol. 48, pp. 1055-1063 (2004).

* cited by examiner

METHOD OF FABRICATING A COMPOSITE SUBSTRATE WITH IMPROVED ELECTRICAL PROPERTIES

TECHNICAL FIELD

The present invention relates to a method of low temperature fabrication of a "hybrid" or "composite" substrate of a type comprising at least one buried insulating layer, for example, an insulating layer interposed between a support substrate and an active layer of semiconductor material that can be derived from a source substrate. The invention also relates to a method of obtaining a composite substrate as mentioned above, with substantially improved electrical properties. The substrates described herein can be used in the fields of optics, electronics, and optoelectronics.

BACKGROUND ART

FIGS. 1A to 1E illustrate the various steps of one mode of fabricating an SOI type substrate, which is known in the art.

Figure 1A:
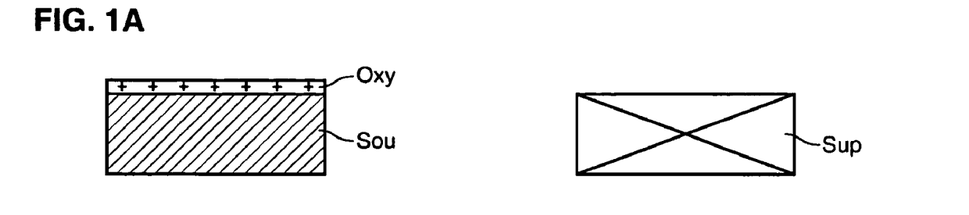
FIGS. 1A to 1E are diagrams representing the various steps in the fabrication of a Silicon-on-Insulator (SOI) type substrate, in accordance with a known prior art implementation.
Figure 1B:
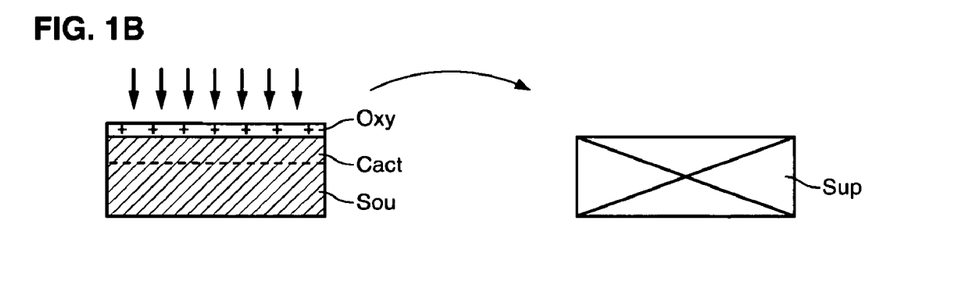

As shown in FIGS. 1A and 1B, the known method consists of oxidizing a source substrate Sou to form a layer of oxide Oxy on a surface of Sou. The method then provides for atomic species implantation in Sou to define an active layer Cact. Oxide layer Oxy is generally fairly thick, of the order of 150 nanometers (nm).

Figure 1C:
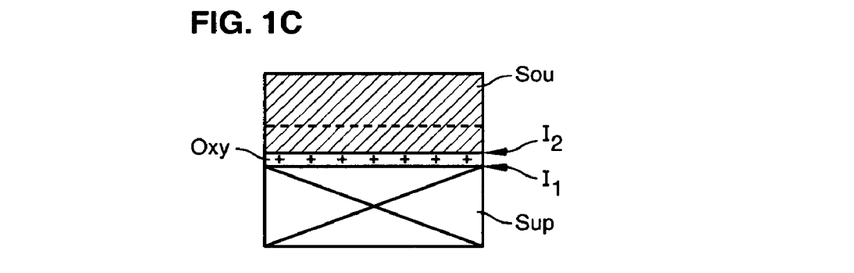
Figure 1D:
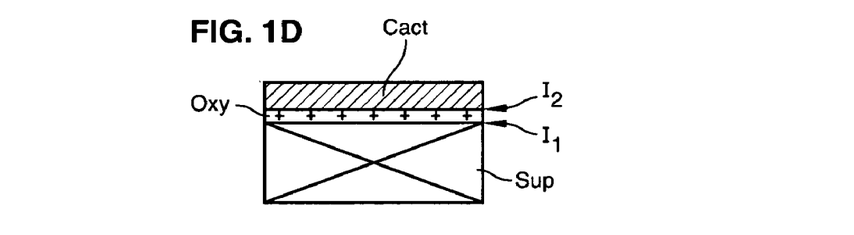
Figure 1E:
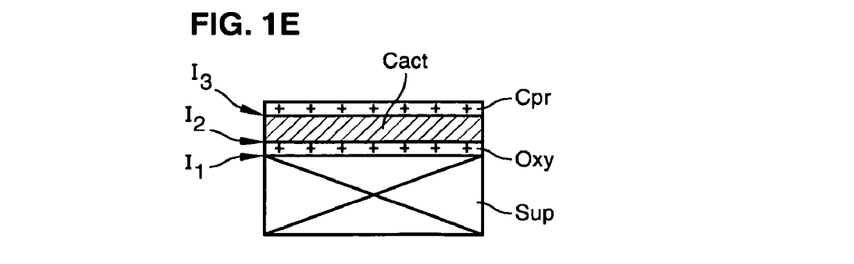

After bonding a surface of oxide Oxy to a support substrate Sup (FIG. 1C), and detaching a remainder of source substrate Sou (FIG. 1D), a composite substrate is obtained comprising oxide layer Oxy interposed between support substrate Sup and an active layer Cact. As illustrated in FIGS. 1C and 1D, oxide layer Oxy has a contact interface $I_1$ with support substrate Sup. Oxide layer Oxy also has a contact interface $I_2$ with active layer Cact.

In some embodiments, a layer may be formed on an exposed surface of the composite substrate obtained, which layer is intended to protect the exposed surface of the upper during finishing heat treatments carried out on the substrate. Substrate Sup is covered with a protective layer Cpr arranged adjacent active layer Cact. An interface $I_3$ is interposed between protective layer Cpr and active layer Cact.

As known in the art, an interface can comprise a trap, wherein a trap has a capacity to retain or release charge carriers at interfaces. A trap can have an extremely deleterious impact on electrical properties of any future electronic components produced on the composite substrate. The density of traps at an interface (hereinafter the "DIT value") is expressed as the number of traps/eV·cm². The higher the DIT value, the worse the electrical properties of the substrate.

For example, a value of $10^{12} \cdot eV^{-1} \cdot cm^{-2}$ considered a high value and can correspond to poor electrical properties for the substrate. Currently, the best DIT values obtained are of the order of $10^{10} \cdot eV^{-1} \cdot cm^{-2}$ for interfaces between very good quality oxides, known as "gate oxides", and their support. Such oxides are found, for example, in transistors, memories, capacitors, and other types of components forming integrated circuits.

The prior art includes methods that can improve or reduce DIT values at certain interfaces of a composite substrate. One of the known methods is Forming Gas Anneal (FGA), which consists of carrying-out a repair/recovery heat treatment of interfaces at a low temperature, on the order of 450° C., in an atmosphere containing hydrogen and a neutral gas.

However, when such a method is carried out at 450° C., improvement to the DIT value is exerted solely on interface $I_3$ between protective layer Cpr and active layer Cact. The improvement in DIT value exerted by FGA treatment on interfaces $I_1$ and $I_2$ is very slight or is none at all. Thus, the FGA treatment method loses effectiveness at each encountered interface. Thus, FGA treatment is relatively ineffective for deep-lying interfaces.

Another method known in the art, consists of carrying out an annealing heat treatment at a high temperature, i.e., above 900° C. or even above 1000° C. Such a treatment may improve the DIT value at the interface $I_2$, but cannot be applied to a certain number of substrates.

This treatment cannot be applied to certain structures formed by bonding, or to composite substrates containing materials that are unstable at high temperature, such as germanium (Ge) or strained Si (sSi), for example. This treatment also cannot be applied to substrates formed from a plurality of materials having significant differences in thermal expansion coefficient (silicon on quartz or SOQ, for example) or substrates containing elements that should not be allowed to diffuse, for example doping profiles or a structure including a metallic ground plane. Thus, it is not possible to apply any DIT improvement treatments employing high temperatures to these types of structures.

In addition, it is also necessary to use for composite substrate fabrication, bonding techniques which do not necessitate high temperature heat treatments. Suni et al, "*Effect of plasma activation on hydrophilic bonding of Si and $SiO_2$,*" Electrochemical Society Proceedings, Volume 2001-27, pp 22-30, describe a technique consisting of preceding the step of bringing the surfaces to be bonded into intimate contact, by a step of plasma activation of at least one of the surfaces to be bonded, namely that of support Sup and/or of source Sou. A high bonding energy is thus obtained at interface $I_1$, close to 1 J/m² (joule/meter²), even after an anneal at 200° C. for just 1 hour. However, plasma activation deteriorates electrical characteristics of interface $I_1$, and in particular DIT values of interface $I_1$, in a fairly significant manner.

An article by K. Schjölberg-Henriksen et al, "*Oxide charges induced by plasma activation for wafer bonding,*" Sensors and Actuators A 102 (2002), 99-105, describes the negative effect of plasma activation on the electrical properties of substrates. This article also shows that it is possible to correct the deleterious effects of plasma activation on electrical properties of substrates by a subsequent FGA type annealing treatment. Using the methods described in the article, a good quality oxide is produced on a silicon substrate, where the DIT value of interface $I_1$ is of the order of several $10^{10} \cdot eV^{-1}$ $cm^{-2}$ after plasma activation, but unfortunately the bonding forces after the FGA treatment are reduced by more than 50%.

In composite substrates, it is important to produce a strong bond in a composite structure, for example, when subsequent thinning of a constituent layer is envisaged, for example, to avoid problems with non transferred zones. Thus improvements in electrical properties of composite substrates, for example, DIT values, while maintaining a strong bond is a composite structure are desirable and necessary. The present invention now provides herein methods and systems for obtaining such improvements.

SUMMARY OF THE INVENTION

The present invention overcomes the disadvantages of the prior art by providing new and useful methods of producing a composite substrate that includes a buried insulating layer having good electrical properties principally at the interface with the active layer which the buried insulating layer supports.

The invention specifically relates to methods of fabricating a composite substrate by providing a source substrate comprising a semiconductor material and a support substrate; providing an insulating layer on the source substrate; applying a recovery heat treatment for heat treatment of the insulating layer under conditions sufficient to enhance the electrical characteristics of the insulating layer and its interface with the semiconductor material of the source substrate; optionally but preferably providing plasma activation on a front face of the recovery heat treated insulating layer or on a front face of the support substrate; bonding the front face of the insulating layer with the front face of the support substrate after plasma activation to form a bonded substrate; and removing a back portion of the source substrate from the bonded substrate while retaining an active layer that comprises a remaining portion of the source substrate bonded to the support substrate with the insulating layer interposed between the support substrate and the active layer.

In one embodiment, the recovery heat treatment comprises a Forming Gas Anneal (FGA) type treatment that comprises annealing the insulating layer in an atmosphere of neutral gas and hydrogen at a temperature of from 400° C. to 600° C. for a period in the range from about thirty minutes to two hours. Alternatively, the recovery heat treatment comprises a heat treatment at a temperature of more than 900° C., in a neutral gas atmosphere for about 30 minutes to an hour, optionally in the presence of oxygen. The variations in these types of heat treatments facilitates manufacture of such composite substrates and provides the designed with numerous options for manufacturing or constructing the desired substrates for the intended end use application.

BRIEF DESCRIPTION OF DRAWINGS

Other characteristics, preferred features and advantages of the invention become apparent from the following description made with reference to the accompanying drawings, which represent a possible implementation in an indicative but non-limiting manner, and wherein.

DETAILED DESCRIPTION OF THE PREFERRED EMBODIMENTS

In the present invention, the term "insulator" designates an electrically insulating material optionally having high dielectric permittivity.

Further, the composite substrates envisaged by the present invention cannot undergo high-temperature heat-treatment without damage. These substrates can be subdivided into two groups:

The first group comprises composite substrates wherein at least one of the substrates interposed between the donor substrate and the receiving substrate cannot be exposed to a temperature defined as "raised", or even to a high temperature. Several types of such donor or receiving substrates can be distinguished:

a) a first type of substrate in the first group comprises composite substrates including elements that might diffuse. For such substrates, the "raised" temperature comprises the temperature beyond which diffusion of an element becomes damaging. This is the case with substrates including, for example:
doping profiles (e.g., boron or arsenic);
buried metallic layers (i.e., ground plane, buried gates); or
stacks of semiconductor layers having sharp interfaces that need to be preserved (e.g., silicon (Si) on silicon germanium (SiGe), or silicon (Si) on germanium (Ge));

b) A second type of substrates in the first group comprises composite substrates that are unstable or liquid at high temperature. This is the case with substrates including, for example:
germanium, for example, has a melting temperature of about 900° C. and cannot be subjected to temperatures higher than 750° C. or in some embodiments even higher than 600° C.;
substrates comprising layers with a strained state that is to be retained (relaxed, or strained in tension or in compression) and which substrates the layers could be perturbed if the substrate were exposed to a high temperature.

The second group comprises composite substrates that cannot be exposed to a raised temperature after bonding the source substrate onto the receiving or support substrate. This can occur either because of differences between the coefficients of thermal expansion of those two materials (this is particularly the case with SOQ substrates); or when the diffusion of elements from one substrate towards another is to be avoided.

The present invention now improves upon the electrical properties of such composite substrates, such as:
charge density (known by the abbreviation "Qbox") in the buried insulating layer. Obtaining a value of less than $5 \times 10^{11}$ charges per $cm^2$ is desirable;
breakdown voltage, i.e. the voltage beyond which the resistivity of the insulator falls sharply. Obtaining maximum values is desirable. As an example, for a buried silicon oxide layer, a preferred value is as close as possible to 10 megavolts/centimeter (MV/cm);
hole and/or electron mobility in the active layer. As an illustrative example, it is desirable to obtain an electron mobility of more than 500 centimeter$^2$·volt$^{-1}$·second$^{-1}$ ($cm^2 \cdot V^{-1} \cdot s^{-1}$) in silicon doped with boron at a concentration of the order of $10^{15}$ atoms/cm$^3$;
Density of Interface Trap (DIT) value, which designates a trap density at an interface between two layers. In the context of the present invention, an improvement is sought in DIT values at the interface between the buried insulating layer and the active layer, and optionally, in DIT values at the interface between the insulating layer and a neighboring layer.

The present invention improves the electrical performance of the final substrate. The DIT value is one of the principal parameters on which steps used in substrate formation can influence. The DIT value or parameter has an effect on mobility.

The present invention is applicable to composite substrates in which at least one layer cannot sustain heat treatments at raised temperatures, for example, temperatures close to 400° C. or 500° C., or even high temperatures of 900° C. or more. The provided method produces a composite substrate in which the transferred active layer adheres very strongly to the insulating layer on which the transferred active layer rests.

To this end, the present invention relate to a method of fabricating a composite substrate with good or improved electrical properties, wherein the substrate is of a type comprising at least one thin insulating layer interposed between a first substrate, termed the "support", and a layer of semiconductor material, termed the "active layer."

In accordance with a preferred embodiment of the invention, the method comprises, in the following order, the steps of:

forming or depositing an insulating layer on a second substrate, termed the "source substrate", and optionally an insulating layer on a support substrate;

applying a recovery heat treatment of the insulating layer on the source substrate and optionally of the insulating layer formed on the support substrate;

conducting plasma activation of at least one of the two faces intended to be bonded together, selected from the front face of the insulating layer of the source substrate, the front face of the support substrate, or the front face of the insulating layer of the support substrate. The plasma activation can be conducted on both faces, if desired;

bonding, by molecular bonding, the support substrate together with the source substrate, such that the insulating layer is located between the support substrate and the source substrate; and removal or lifting off a portion, termed the "back", of the source substrate, to retain only a thickness of material constituting the active layer and to produce the composite substrate.

In some embodiments, the recovery heat treatment can comprise an FGA type treatment carried out by annealing in an atmosphere of neutral gas and hydrogen, at a temperature in the range of from about 400° C. to about 600° C., for a period in the range from about thirty minutes to about two hours. In other embodiments, the recovery heat treatment can comprise a heat treatment at a temperature greater than about 900° C., in a neutral gas atmosphere, optionally in the presence of oxygen, for about 30 minutes to about 1 hour.

The recovery heat treatment can comprise a Rapid Thermal Annealing (RTA) type heat treatment carried out for several seconds to several minutes, approximately.

The plasma activation treatment is optional but is used as it is considered to be beneficial in enhancing bonding between the substrates. The plasma activation comprises introducing the substrate to be treated into an activation chamber and exposing the substrate therein, for about 5 seconds to about 60 seconds, to a plasma formed from a pure gas selected from oxygen ($O_2$), nitrogen ($N_2$), argon (Ar), helium (He) or a mixture thereof, said gas being introduced into the activation chamber at a flow rate in the range from about 10 standard cubic centimeters per minute (sccm) to about 1000 sccm, the established pressure in the chamber being in the range from about 10 milliTorr (mTorr) to about 200 mTorr, the plasma being initiated then maintained by applying radio-frequency power in the range from about 100 watts (W) to about 3000 W.

In some embodiments, the insulating layer is an oxide. In other embodiments, the insulating layer is a high permittivity dielectric material. The high permittivity dielectric material can be selected from the group consisting of hafnium dioxide ($HfO_2$), yttrium oxide ($Y_2O_3$), strontium and titanium trioxide ($SrTiO_3$), alumina ($Al_2O_3$), zirconium dioxide ($ZrO_2$), tantalum pentoxide ($Ta_2O_5$), titanium dioxide ($TiO_2$), their nitrides, and their silicides.

The back portion of the source substrate may be lifted off by grinding or polishing. Alternatively, the method comprises forming a zone of weakness inside the source substrate prior to the plasma activation step and lifting-off of the back portion of the source substrate, by detachment along the zone of weakness. The zone of weakness can be obtained by atomic species implantation inside the source substrate according to the known SMART-CUT® technique.

The active layer can be produced from a material selected from silicon, germanium, and strained silicon. In some embodiments, the method includes a step of doping all or part of one of the source or support substrates prior to applying the recovery heat treatment since that heat treatment generally does not cause diffusion of the dopant(s).

The various steps of the method of fabricating a composite substrate of the invention are described briefly with reference to FIGS. 2A to 2F.

Figure 2A:
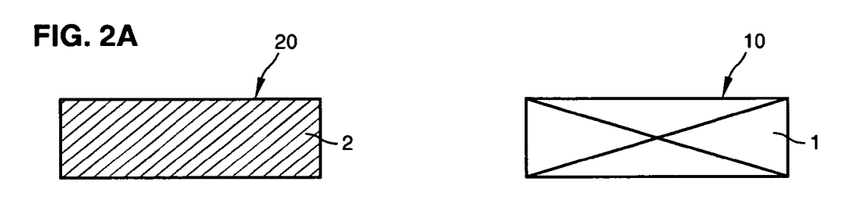
FIGS. 2A to 2F are diagrams representing the various steps in the fabrication method in accordance with a first implementation of the invention.

Referring to FIG. 2A, it can be seen that the method uses a first substrate 1, termed the "support substrate", and a second substrate 2, termed the "source substrate". Support substrate 1 comprises an upper face 10 and source substrate 2 comprises an upper face 20.

Figure 2B:
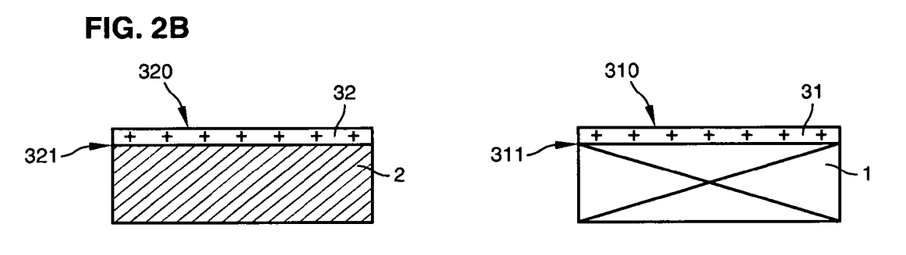

As can be seen in FIG. 2B, an insulating layer 32 is then formed or deposited on at least source substrate 2. In some embodiments, an insulating layer 31 can be formed or deposited optionally on support substrate 1.

Free surfaces or front faces 310, 320 of insulating layers 31, 32 respectively can also in seen in FIG. 2B. An interface 311 is formed between insulating layer 31 and support substrate 1. An interface 321 is formed between insulating layer 32 and source substrate 2.

Figure 2C:
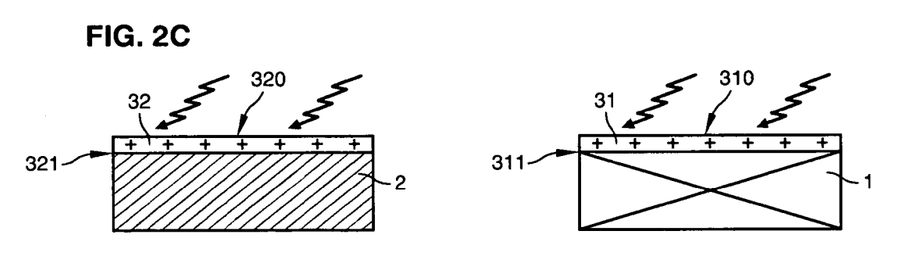

FIG. 2C depicts results of a heat treatment carried out on source substrate 2 that has been covered with insulating layer 32, to "recover" insulating layer 32. The heat treatment can improve electrical characteristics of insulating layer 32 and interface 321. Throughout the remainder of the description and claims, this treatment is termed "recovery heat treatment".

When insulating layer 31 is present on support substrate 1, insulating layer 31 may optionally also undergo a recovery heat treatment to improve electrical characteristics of insulating layer 31 and interface 311.

Figure 2D:
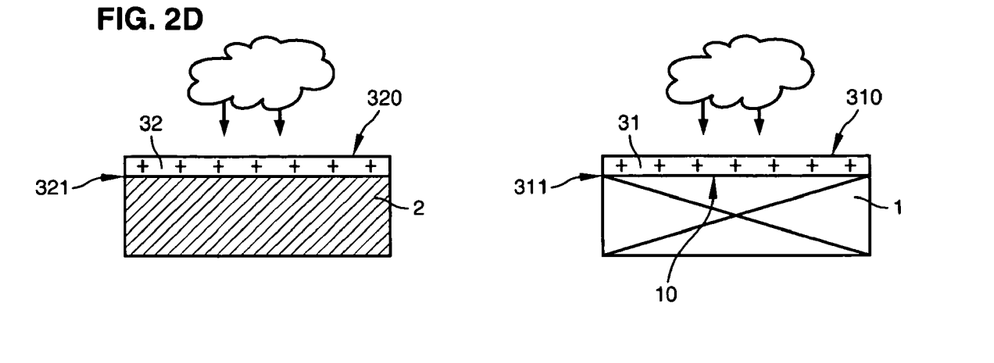

FIG. 2D illustrates a plasma activation step that is carried out over one or both of the faces intended to be bonded to each other, i.e., over one or both of faces 320, 310, or 10. Face 10 can be treated by the plasma activation step when insulating layer 31 is not arranged on upper face 10 of first substrate 1.

Figure 2E:
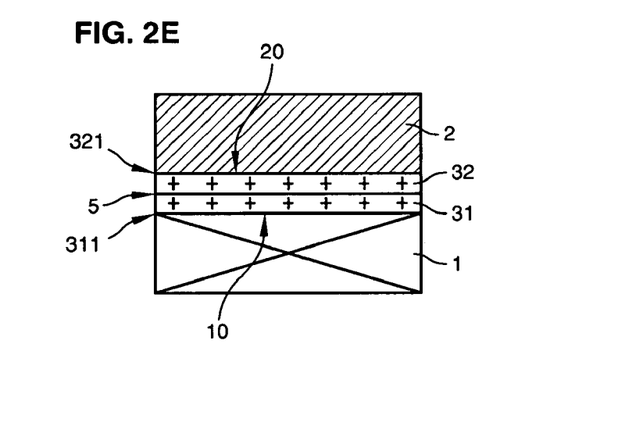

Bonding, for example, by molecular bonding, of support substrate 1 and source support 2 is then carried out such that faces 10, 20 are arranged facing each other (see FIG. 2E). A bonding interface 5 is defined where faces 10, 20 are bonded together.

Figure 2F:
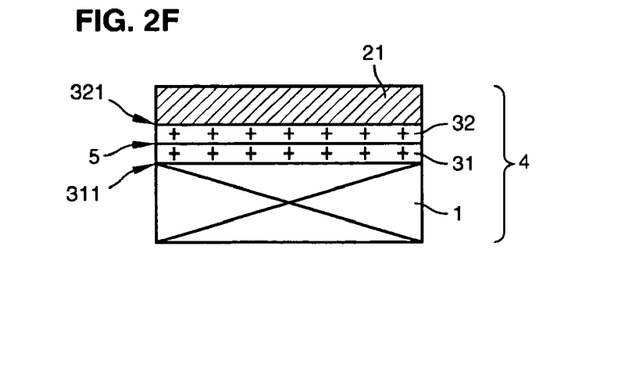

As illustrated in FIG. 2F, a portion termed the "back" portion of source substrate 2 is lifted off to retain only a thickness or portion of material from source substrate 2 remains. The remaining portion of source substrate 2 constitutes an active layer 21. The structure formed by these steps comprises a composite substrate 4. Composite substrate 4 can comprise a final composite substrate.

Various steps comprising the method and the materials selected are described below in greater detail.

In composite substrate 4, substrate 1 acts as a mechanical support. In some embodiments, support substrate 1 can include or contain elements that can be constituents of any final electronic components formed from composite substrate 4, such as electrodes, a ground plane, a channel, etc.

Support substrate 1 is advantageously produced from a semiconductor material. Active layer 21 of composite substrate 4 is derived from source substrate 2, as described above with reference to FIG. 2E. Source substrate 2 can comprise a semiconductor material.

Purely by way of illustrative example, various examples of materials that may be used as substrates 1 and 2 are listed herein. Support substrate 1 can comprise silicon (Si), silicon carbide (SiC), germanium (Ge), any epitaxially grown layer, for example a layer of germanium (Ge), silicon germanium (SiGe) or gallium nitride (GaN) on a silicon substrate, or even a layer of strained silicon. Source substrate 2 can comprise silicon (Si), germanium (Ge), silicon carbide (SiC), gallium nitride (GaN), silicon germanium (SiGe), gallium arsenide (AsGa), or indium phosphide (InP). In some embodiments, substrates 1 and 2 may be multilayered. In some embodiments, substrate 1 and 2 can comprise composite substrates.

The present invention are of particular application to form or produce composite substrates including a layer that does not tolerate raised or high temperature heat treatments. Examples of materials that can be a constituent of substrates 1 or 2 can comprise strained silicon, germanium, a metallic or doped layer, or contiguous layers of semiconductors which are capable of diffusing into each other.

Insulating layers 31, 32 are selected, for example, from layers of oxide or nitride, such as silicon oxide ($SiO_2$) or silicon nitride ($Si_3N_4$); germanium oxynitride ($Ge_xO_yN_z$), aluminum nitride (AlN); high permittivity (high k) dielectric materials such as hafnium dioxide ($HfO_2$), yttrium oxide ($Y_2O_3$), strontium and titanium trioxide ($SrTiO_3$), alumina ($Al_2O_3$), zirconium dioxide ($ZrO_2$), tantalum pentoxide ($Ta_2O_5$), titanium dioxide ($TiO_2$), their nitrides, and their silicides.

The nature of each insulating layer 31 or 32 is selected as a function of the nature of the materials used for support substrate 1 and source substrate 2. Further, insulator 32 can be selected to optimize the electrical properties of interface 321.

By way of example, to produce a final substrate 4 of the GeOI (Germanium On Insulator) type, a thin layer of silicon oxide may be formed on a silicon support substrate and a layer of $HfO_2$ can be formed on a germanium source substrate.

Preferably, insulators 31, 32 are of excellent quality as regards their electrical properties. More precisely, insulator 32 has DIT values at interface 321 which are as low as possible.

By way of illustrative example, when layers 1 and 2 are formed from silicon and insulating layers 31, 32 are formed from silicon dioxide using the present invention, the DIT values at interfaces 311 and/or 321 are $10^{11} \cdot eV^{-1} \cdot cm^{-2}$ or less, or even $10^{10} \cdot eV^{-1} \cdot cm^{-2}$ or less.

Next, when the insulator is an oxide, it is formed with all precautions taken to form oxides of optimum quality, such as gate oxides. Reference in this regard should be made to the article by Green et al, *"Ultrathin (<4 nm) $SiO_2$ and Si—O—N gate dielectric layers for silicon microelectronics: Understanding the processing, structure and physical and electrical limits,"* Journal of Applied Physics, volume 90, n° 5, 1 Sep. 2001, pages 2086 ff.

The surfaces of substrates 1 and 2, for example, faces 10 and 20, on which the oxide is formed are prepared by deep cleaning, for example using a treatment in an [Please expand RCA] "RCA" chemical, to prevent any contamination. "RCA" treatment comprises treating the surfaces in succession with two solutions. A first solution, known by the acronym "SC1" (standard clean 1), comprises a mixture of ammonium hydroxide ($NH_4OH$), hydrogen peroxide ($H_2O_2$) and deionized water. A second solution, known by the acronym "SC2" (standard clean 2), comprises a mixture of hydrochloric acid (HCl), hydrogen peroxide ($H_2O_2$) and deionized water.

Insulating layers 31, 32 or the oxides are then obtained by an oxidation heat treatment respectively of support substrate 1 and/or source substrate 2. Insulating layers 31, 32 may also be obtained by Low Pressure Chemical Vapor Deposition (LPCVD) or by an Atomic Layer Deposition (ALD) method.

Recovery Heat Treatment:

The recovery treatment may be carried out in different ways, as shown in FIG. 2C.

A first possibility consists of carrying out an Forming Gas Anneal (FGA) type thermal anneal. Preferably, the FGA treatment is carried out in an atmosphere of a neutral gas and hydrogen, at a temperature in the range from about 400° C. to about 600° C., preferably close to about 450° C., for a period in the range of from about thirty minutes to about two hours, preferably about 90 minutes. The treatment can be carried out, for example, in a tube furnace under a controlled atmosphere.

The insulating layer that underwent the FGA treatment thus can have relatively low "DIT" values at an interface with a substrate on which it has been formed. The "DIT" values achieved are below $10^{11} \cdot eV^{-1} cm^{-2}$, or even below a few $10^{10} \cdot eV^{-1} cm^{-2}$.

A second possibility consists of carrying out a high temperature thermal anneal, i.e. at a temperature of more than 900° C., or even 1100° C., in an atmosphere of a neutral gas (for example argon) or a neutral gas and oxygen, for about 30 minutes to 1 hour. The treatment is carried out, for example, in a tube furnace under a controlled atmosphere.

This second possibility is employed if one of the two substrates can tolerate such treatments. In some embodiments, the treatment is only applied to the substrate, or the substrate can be optionally covered with an insulating layer, which can tolerate the treatment. The high temperature treatment may optionally be carried out as a complement to the FGA treatment, and preferably before the FGA treatment.

Finally, it should be noted that in a variation, the two types of thermal anneal cited above may be carried out in Rapid Thermal Annealing (RTA) equipment. The approximate duration of the recovery anneal method is thus from several seconds to several minutes, typically 30 seconds.

Plasma Activation Treatment:

When used, the plasma activation treatment (FIG. 2D) is carried out under conditions which preserve the electrical characteristics and in particular the DIT values of the interface between a insulating layer and a neighboring layer, when such a neighboring layer exists. In fact, the DIT values have already been reduced, and thus improved, at the end of the preceding recovery heat treatment.

"Plasma activation" of a surface is defined as exposing the surface to a plasma. In particular, the exposure may be carried out, for example, in a vacuum or atmospheric pressure chamber. The activation is carried out by controlling various exposure parameters such as nature, flow rate or pressure of the gas. The gas is supplied to the chamber, inside which activation is carried out. The activation can also be controlled by controlling the power being applied to the activation.

In the present invention, first a substrate covered with an insulating layer to be activated is introduced into the activation chamber. Then a gas, for example, a pure gas, typically oxygen ($O_2$), optionally nitrogen ($N_2$), argon (Ar) or helium (He), or a mixture of gases, for example, oxygen and helium, oxygen and argon, or helium and nitrogen, is sent into the chamber, from which the plasma is generated once the power is applied.

The flow rate of the gas used is a function of the volume of the activation chamber and the size of the substrate. Preferably, the gas is sent in at a flow rate in the range about 10 sccm to about 1000 sccm. By way of example, a flow rate of about 75 sccm is used when a substrate about 200 mm in diameter is used, and a flow rate of about 200 sccm is used for a substrate about 300 mm in diameter.

The established pressure in the chamber during plasma treatment is controlled, so that it is in the range from about 10 mTorr to about 200 mTorr, typically close to about 50 mTorr (1 mTorr being equal to $1.33 \times 10^{-1}$ Pa).

The plasma is initiated then maintained by applying radiofrequency (RF) power in the range from about 100 W to about 2000 W, preferably close to about 250 W in the case of a substrate about 200 mm in diameter and in the range about 100 W to about 3000 W, preferably close to about 500 W in the case of a substrate about 300 mm in diameter.

The surface of the face to be bonded is then exposed to the plasma for about 5 to about 60 seconds, preferably about 10 seconds to about 30 seconds. It is also appropriate to limit the exposure time for the plasma treatment to what is strictly necessary. Preferably, this is less than one minute, or better still less than 30 seconds. Prolonged exposure to the plasma can risk causing an accumulation of electric charges in the insulator and an increase in the charge density of the insulator (QBox), which can counter the improvements in electrical performances discussed above.

Removal of the Back Portion of the Source Substrate:

The removal of this portion may be conducted in various ways. It may, for example, be lifted off by grinding and/or polishing. Alternatively, the back portion is lifted off by forming a zone of weakness in the substrate and then detaching the portion at the zone of weakness. This variation is illustrated in FIGS. 3A to 3G, in which elements identical to those described above carry the same reference numerals.

Figure 3A:
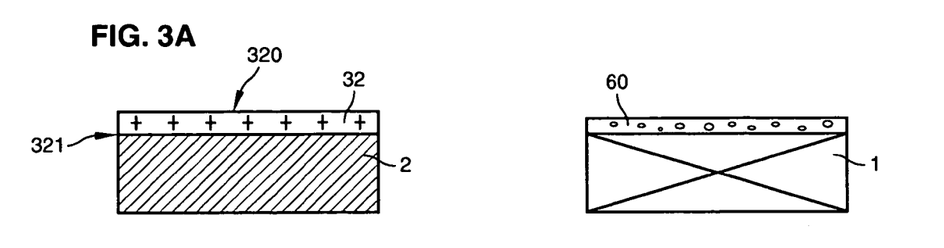
FIGS. 3A to 3G are diagrams representing variations of the above method.
Figure 3B:
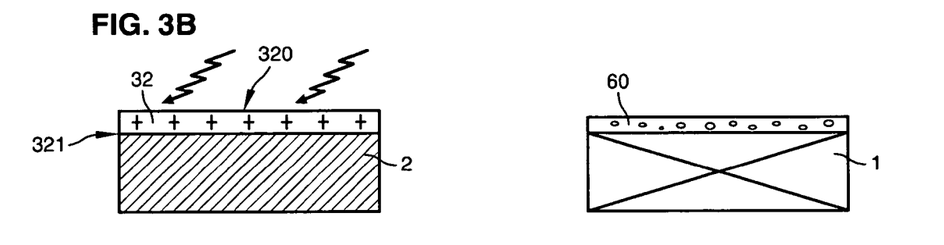
Figure 3C:
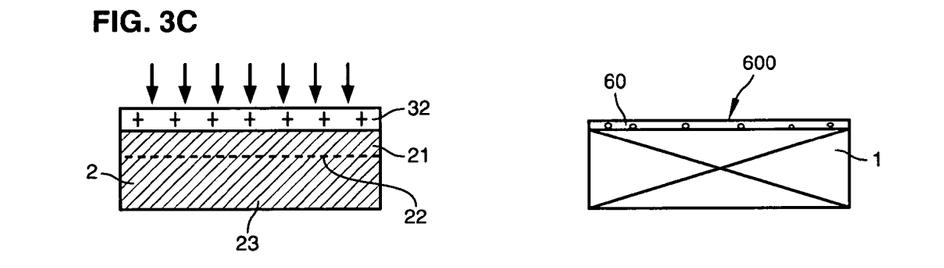
Figure 3D:
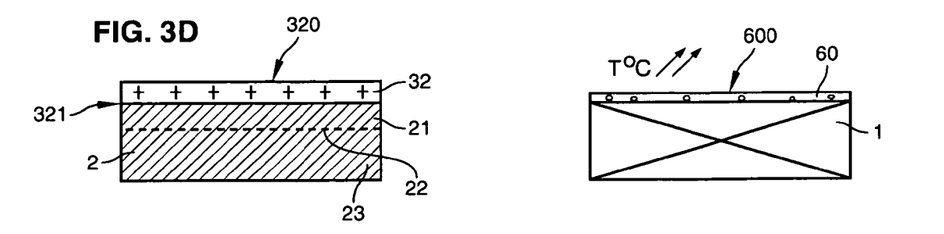
Figure 3E:
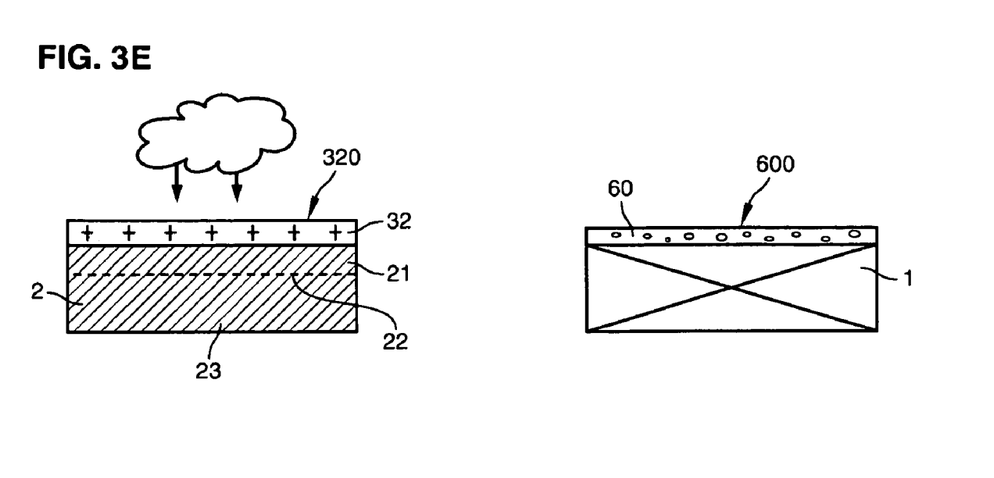
Figure 3F:
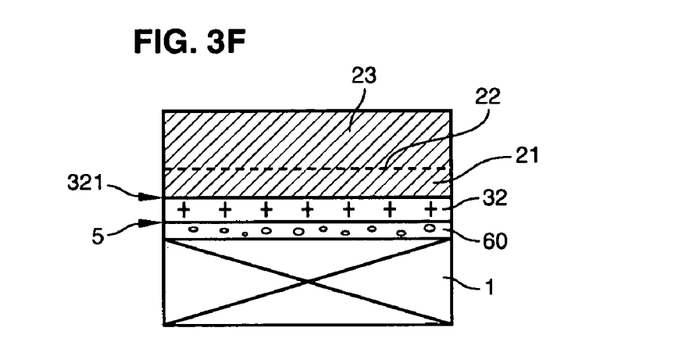

A zone of weakness 22 formed inside source substrate 2 delimits active layer 21 from a back portion 23 (see FIG. 3F). Zone 22 may be formed by a porous zone; in this regard, reference should be made to the article by K. Sakaguchi et al, *"Eltran® by splitting porous Si layers,"* The ElectroChemical Society Inc PV99-3, Silicon-on-insulator technology and devices, P. L. Hemment, pp 117-121. In some embodiments, zone 22 is advantageously formed by implantation of light atomic species, preferably hydrogen and/or helium ions, so as not to deteriorate insulating layer 32 (see also, FIG. 2C).

Reference regarding implantation conditions should be made to the article by C. Maleville and C. Mazuré, *"Smart Cut™ technology: from 300 nm ultrathin SOI production to advanced engineered substrates,"* Solid State Electronics 48 (2004), 1055-1063, which describes the SmartCut® method used here.

When atomic species implantation is used, this is carried out after the recovery heat treatment step illustrated in FIG. 3B.

The step for detachment of back portion 23 along zone 22 can include applying a stress of thermal or mechanical origin, for example an anneal treatment or introducing a blade to zone of weakness 22.

EXAMPLES

Two particular implementations will now be described.

Example 1

Preparation of a Substrate Including an Active Layer that Comprises a Ground Plane (Known by the Acronym "GP-SOI", or "Ground Plane Silicon on Insulator")

This example will be described with reference to FIGS. 3A to 3G. A silicon support substrate 1 was covered with a deposit of a thin layer 60 about 1 micrometer (μm) thick and highly doped with boron (see FIGS. 3A and 3B), to define a ground plane therein.

This highly doped layer had a front face 600 that was used for bonding (see FIG. 3C). Front face 600 was polished or smoothed to reduce its roughness and render front face 600 to render front face 600 compatible with bonding.

As shown in FIG. 3D, support substrate 1 was covered with a doped layer 60 and then underwent a high temperature thermal annealing treatment or RTA, typically at 1050° C. for about 10 seconds. Further, a silicon source substrate 2 was used, oxidized by dry oxidation.

Silicon source substrate 2 was covered with a layer 32 of $SiO_2$ about 50 nanometers (50 nm) thick. Layer 32 then underwent an FGA type recovery treatment, at 450° C., for about an hour and a half, (see FIG. 3B). Insulating or oxide layer 32 had DIT values of several $10^{10} \cdot eV^{-1} \cdot cm^{-2}$.

As can be seen in FIG. 3C, substrate 2 underwent hydrogen ion implantation using a dose of $5.5 \times 10^{16} \cdot H^+/cm^2$, and an implantation energy of 37 keV, to define the zone of weakness 22.

Free surface 320 of oxide layer 32 underwent plasma activation (FIG. 3E). Substrate 2 was 300 mm in diameter, and the following parameters were used: oxygen plasma, 200 sccm flow rate, 500 W power, 50 mTorr pressure, for 30 seconds.

Figure 3G:
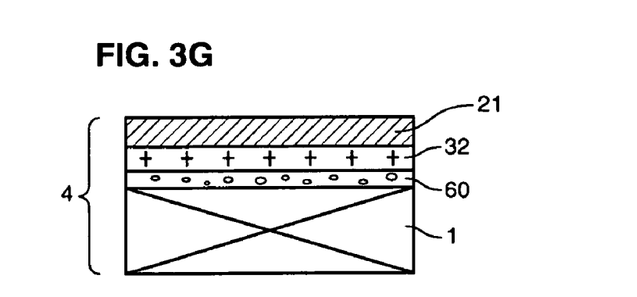

After bonding by molecular bonding (FIG. 3F) and detachment of the back portion of the source substrate by heat treatment close to 500° C. for a short period, the composite substrate shown in FIG. 3G was obtained. It should be noted that the post-bonding heat treatment was deliberately limited to prevent any boron from diffusing into the oxide or into the active layer, which would run the risk of reducing the electrical performance.

Said composite substrate had DIT values of several $10^{10} \cdot eV^{-1} \cdot cm^{-2}$.

Example 2

Preparation of a Composite Substrate Comprising an Active Layer of Silicon on a Stack of Oxide and Quartz The same type of source substrate 2 used in Example 1 was employed in Example 2. It underwent the same treatments, with the exception of the recovery treatment that was carried out by a high temperature anneal at 1100° C., and the formation of the zone of weakness was carried out by co-implantation of helium using a dose of $1.5 \times 10^{16} He^+/cm^2$ and hydrogen using a dose of $1 \times 10^{16} H^+/cm^2$.

Further, a quartz support substrate 1 comprising a front face 10 that underwent plasma activation using the parameters used in Example 1 for substrate 2 was used.

The composite substrate thus obtained had DIT values at the interface between the oxide and the silicon of the order of several $10^{10} \cdot eV^{-1} \cdot cm^{-2}$.

In accordance with the invention, the fact that the recovery treatment was carried out systematically prior to plasma activation meant that the bonding energy was not reduced but the "DIT" values were kept extremely low. Bonding was thus strong, and subsequent thinning of the source substrate was facilitated.

What is claimed is:

1. A method of fabricating a composite substrate which comprises:
    providing a source substrate comprising a semiconductor material and a support substrate;
    providing an insulating layer on the source substrate;

applying a recovery heat treatment for heat treatment of the insulating layer under conditions sufficient to enhance the electrical characteristics of the insulating layer and its interface with the semiconductor material of the source substrate;

providing plasma activation after applying the recovery heat treatment either on a front face of the recovery heat treated insulating layer, on a front face of the support substrate, or on both faces, to enhance bonding strength compared to faces(s) that do not receive plasma activation after the recovery heat treatment;

bonding the front face of the insulating layer with the front face of the support substrate after plasma activation to form a bonded substrate; and removing a back portion of the source substrate from the bonded substrate while retaining an active layer that comprises a remaining portion of the source substrate bonded to the support substrate with the insulating layer interposed between the support substrate and the active layer.

2. The method according to claim 1, wherein the recovery heat treatment comprises a Forming Gas Anneal (FGA) type treatment that comprises annealing the insulating layer in an atmosphere of neutral gas and hydrogen at a temperature of from 400° C. to 600° C. for a period in the range from about thirty minutes to two hours.

3. The method according to claim 1 wherein the recovery heat treatment comprises a heat treatment at a temperature of more than 900° C., in a neutral gas atmosphere for about 30 minutes to an hour, optionally in the presence of oxygen.

4. The method according to claim 3 wherein the recovery heat treatment comprises a Rapid Thermal Annealing (RTA) type heat treatment carried out for several seconds to several minutes.

5. The method according to claim 1, wherein the plasma activation treatment comprises introducing the substrate to be treated into an activation chamber, establishing a pressure in the chamber of from about 10 mTorr to about 200 mTorr, exposing the substrate therein for about 5 seconds to 60 seconds to a plasma formed from a pure gas selected from oxygen ($O_2$), nitrogen ($N_2$), argon (Ar) and helium (He) or a mixture thereof, introducing the plasma forming gas into the chamber at a flow rate in a range from 10 sccm to 1000 sccm, initiating the plasma, and then maintaining the plasma by applying radiofrequency power in a range of from 100 W to 3000 W.

6. The method according to claim 1, wherein the insulating layer comprises an oxide that is formed or deposited on the source substrate.

7. The method according to claim 1, wherein the insulating layer comprises a high permittivity dielectric material.

8. The method according to claim 7, wherein the high permittivity dielectric material is selected from the group consisting of hafnium dioxide ($HfO_2$), yttrium oxide ($Y_2O_3$), strontium and titanium trioxide ($SrTiO_3$), alumina ($Al_2O_3$), zirconium dioxide ($ZrO_2$), tantalum pentoxide ($Ta_2O_5$), titanium dioxide ($TiO_2$), their nitrides and their silicides.

9. The method according to claim 1, wherein the back portion of the source substrate is removed by grinding or polishing.

10. The method according to claim 1, which further comprises providing a zone of weakness inside the source substrate wherein the removal comprises detaching the back portion of the source substrate along the zone of weakness.

11. The method according to claim 10, wherein the zone of weakness is obtained by atomic species implantation inside the source substrate.

12. The method according to claim 1, wherein the active layer is a material selected from silicon, germanium and strained silicon.

13. The method according to claim 1, further comprising doping a portion of the source or support substrates prior to applying the recovery heat treatment.

14. The method according to claim 1, which further comprises providing an insulating layer on the support substrate.

15. The method according to claim 14 which further comprises applying a recovery heat treatment to the insulating layer on the support substrate, wherein the recovery heat treatment is the same as that applied to the insulating layer on the source substrate.

16. The method according to claim 14 which further comprises applying a recovery heat treatment to the insulating layer on the support substrate, wherein the recovery heat treatment is different than that applied to the insulating layer on the source substrate.

17. The method according to claim 14, wherein the insulating layer on the support forms a front face of the support substrate and is treated for bonding to a front face of the source substrate.

18. The method according to claim 1, wherein the electrical properties are enhanced so that DIT values at the interface of the insulating layer and the active layer are below $10^{11} \cdot eV^{-1} \cdot cm^{-2}$.

19. The method according to claim 18, wherein the DIT values are less than $10^{10} \cdot eV^{-1} \cdot cm^{-2}$.

20. The method according to claim 1 wherein the bonding strength of the front face of the insulating layer with the front face of the support substrate after plasma activation is not reduced compared to faces(s) that do not receive plasma activation after the recovery heat treatment.

* * * * *